(12) United States Patent
Kemink et al.

(10) Patent No.: US 7,100,281 B2
(45) Date of Patent: Sep. 5, 2006

(54) HEAT SINK AND METHOD OF MAKING THE SAME

(75) Inventors: Randall G. Kemink, Poughkeepsie, NY (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 10/800,564

(22) Filed: Mar. 15, 2004

(65) Prior Publication Data

US 2005/0199371 A1    Sep. 15, 2005

(51) Int. Cl.
*B23P 15/26* (2006.01)
*H05K 7/20* (2006.01)

(52) U.S. Cl. ............... 29/890.054; 29/890.03; 29/890.043; 29/890.047; 361/709; 361/710; 361/711

(58) Field of Classification Search ............. 29/890.03, 29/890.054, 890.047, 890.048, 890.049; 165/80.3; 361/703, 704, 709, 710, 711
See application file for complete search history.

(56) References Cited

U.S. PATENT DOCUMENTS

| | | | | |
|---|---|---|---|---|
| 4,535,835 A | * | 8/1985 | Holden | ............... 165/134.1 |
| 5,172,755 A | * | 12/1992 | Samarov | ............... 165/80.3 |
| 5,945,217 A | * | 8/1999 | Hanrahan | ............... 428/389 |
| 6,257,327 B1 | | 7/2001 | Rembold et al. | |
| 6,333,551 B1 | | 12/2001 | Caletka et al. | |
| 6,407,924 B1 | | 6/2002 | Brodsky | |
| 6,552,906 B1 | * | 4/2003 | Kanada | ............... 361/705 |
| 6,633,488 B1 | * | 10/2003 | Morita | ............... 361/753 |
| 6,911,728 B1 | * | 6/2005 | Ishikawa et al. | ............... 257/706 |

FOREIGN PATENT DOCUMENTS

| JP | 04-096355 | * | 3/1992 |
|---|---|---|---|
| JP | 2003-068949 | * | 3/2003 |

* cited by examiner

*Primary Examiner*—Eric Compton
(74) *Attorney, Agent, or Firm*—Lily Neff; Cantor Colburn LLP

(57) ABSTRACT

A method for manufacturing a heat sink including heating a metal base to melt solder in grooves formed in the base. The base has a first coefficient of thermal expansion. The solder has a second coefficient of thermal expansion lower than the first coefficient of thermal expansion. The metal base and the solder are cooled and the metal base experiences tensile stresses and the solder experiences compressive stresses to form a concavity in a thermal face of the base. The thermal face is then planed. Over time, the tensile stresses and the compressive stresses reduce such that the thermal face becomes convex.

7 Claims, 4 Drawing Sheets

HEAT SINK AND METHOD OF MAKING THE SAME

BACKGROUND OF THE INVENTION

The present disclosure relates generally to heat sinks and more particularly to heat sinks having a convex contact surface and a method of making the same. Heat sinks are used to conduct heat away from a surface of a device such as a microprocessor. Heat sinks feature a thermal face, which is in thermal communication with a device from which heat is to be conducted.

FIG. 1 depicts a conventional heat sink 10 having a thermal face 12 that is concave. In the example shown in FIG. 1, the distance d is about 25 um. Heat sink 10 includes a base 14 made from a metal (e.g., copper) having a plurality of metal (e.g., copper) fins 16 secured to the base 14. Fins 16 are positioned in grooves 18 and secured to base 14 by solder 20 which is a Pb—Sn solder.

FIGS. 2a–2d illustrate the manufacturing process for heat sink 10 of FIG. 1. The upper portion of base 14 including grooves 18, solder 20 and a portion of base 14 is represented as region 22 for convenience of illustration. FIG. 2a depicts heat sink 10 heated above a melting temperature of Pb—Sn solder 20. Fins 16 are then placed in solder 20 in grooves 18. The heat sink 10 is then cooled to room temperature as shown in FIG. 2b. Due to the differing coefficients of thermal expansion (CTE) between solder 20 and base 14, the solder 20 goes into tension and the base 14 goes into compression. The CTE of the solder 20 is about 25 ppm/C and the CTE of the copper base 14 and copper fins 16 is about 17 ppm/C.

The thermal face 12 is then machined to be planar as shown in FIG. 2c. Over time, the tensile stresses in solder 20 relieve and solder 20 stretches. The compressive stresses in copper base 14 relieve over time and the copper base 14 shrinks. This results in thermal face 12 being concave as shown in FIG. 2d. The concavity of thermal face 12 results in reduced contact between the heat sink 10 and the surface from which heat is to be transferred and poor heat transfer performance.

SUMMARY OF THE INVENTION

One embodiment is a method for manufacturing a heat sink including heating a metal base to melt solder in grooves formed in the base. The base has a first coefficient of thermal expansion. The solder has a second coefficient of thermal expansion lower than the first coefficient of thermal expansion. The metal base and the solder are cooled and the metal base experiences tensile stresses and the solder experiences compressive stresses to form a concavity in a thermal face of the base. The thermal face is then planed. Over time, the tensile stresses and the compressive stresses relax such that the thermal face becomes convex.

Another embodiment is a heat sink including a metal base having a first coefficient of thermal expansion. The base has a thermal face for contacting a surface from which heat is to be conducted. A plurality of grooves are formed in the base and a plurality of fins are positioned in the grooves. The fins are secured to the base with solder. The solder has a second coefficient of thermal expansion lower than the first coefficient of thermal expansion so that the thermal face is convex.

BRIEF DESCRIPTION OF THE DRAWINGS

Referring to the exemplary drawings wherein like elements are numbered alike in the accompanying Figures.

DETAILED DESCRIPTION OF THE INVENTION

Figure 4:
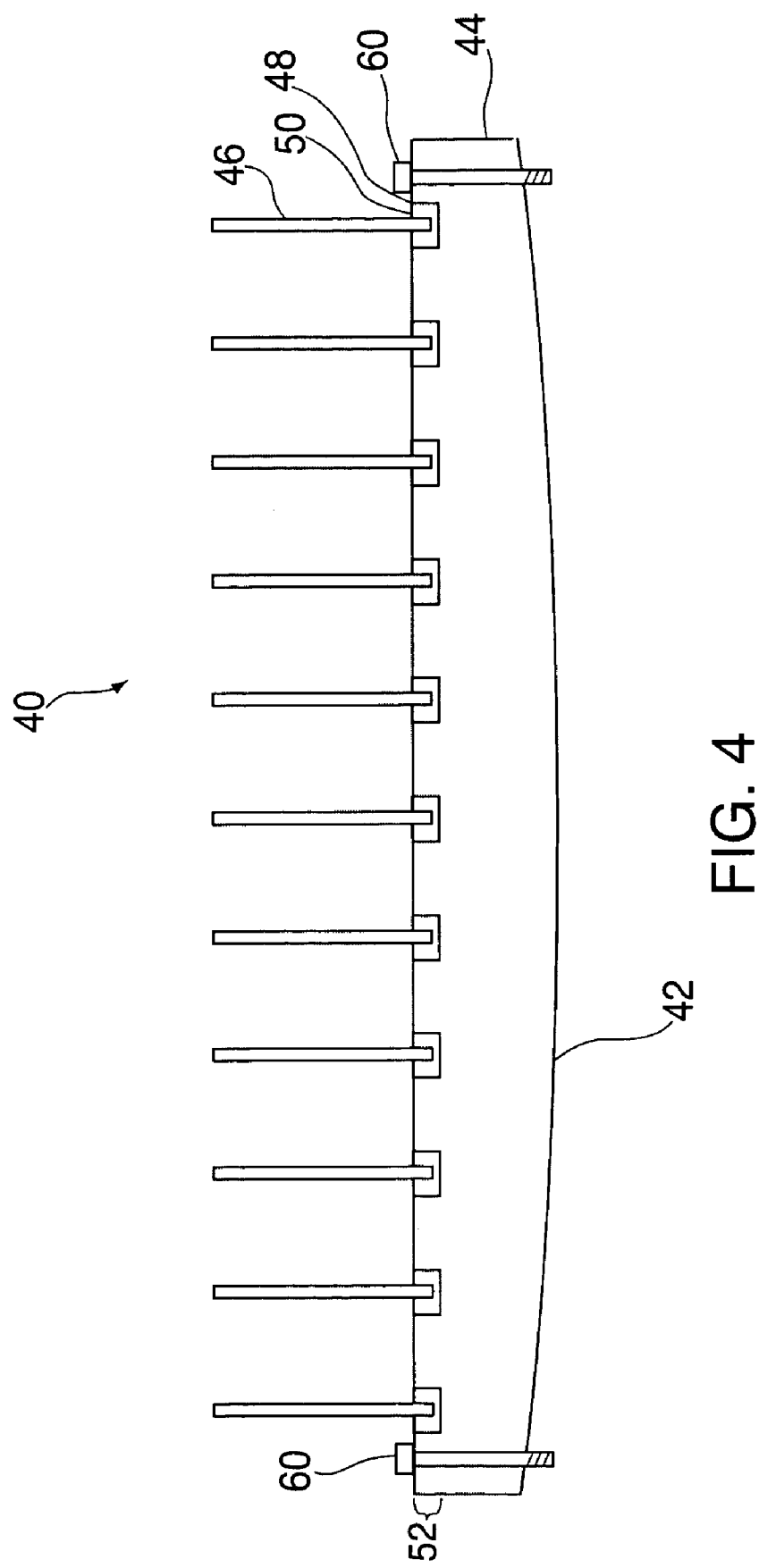
FIG. 4 depicts a heat sink in an exemplary embodiment of the invention.

An embodiment of the invention is a heat sink having a convex thermal face to improve contact with a surface and improve thermal transfer from that surface. FIG. 4 depicts a heat sink 40 in an embodiment of the invention. Heat sink 40 has a convex thermal face 42. Heat sink 40 includes a base 44 made from a metal (e.g., copper) having a plurality of metal (e.g., copper) fins 46 secured to the base 44. In one embodiment, base 44 is copper having a CTE of about 17 ppm/C and fins 46 are copper having a CTE of about 17 ppm/C. Fins 46 are positioned in grooves 48 and secured to base 44 by solder 50. Solder 50 has a CTE less than the CTE of the base 44. In one embodiment, solder 50 is 90In-10Ag which has a CTE of about 15 ppm/C. In an alternate embodiment, solder 50 is Sn—Bi which has a CTE of about 15 ppm/C.

Figure 1:
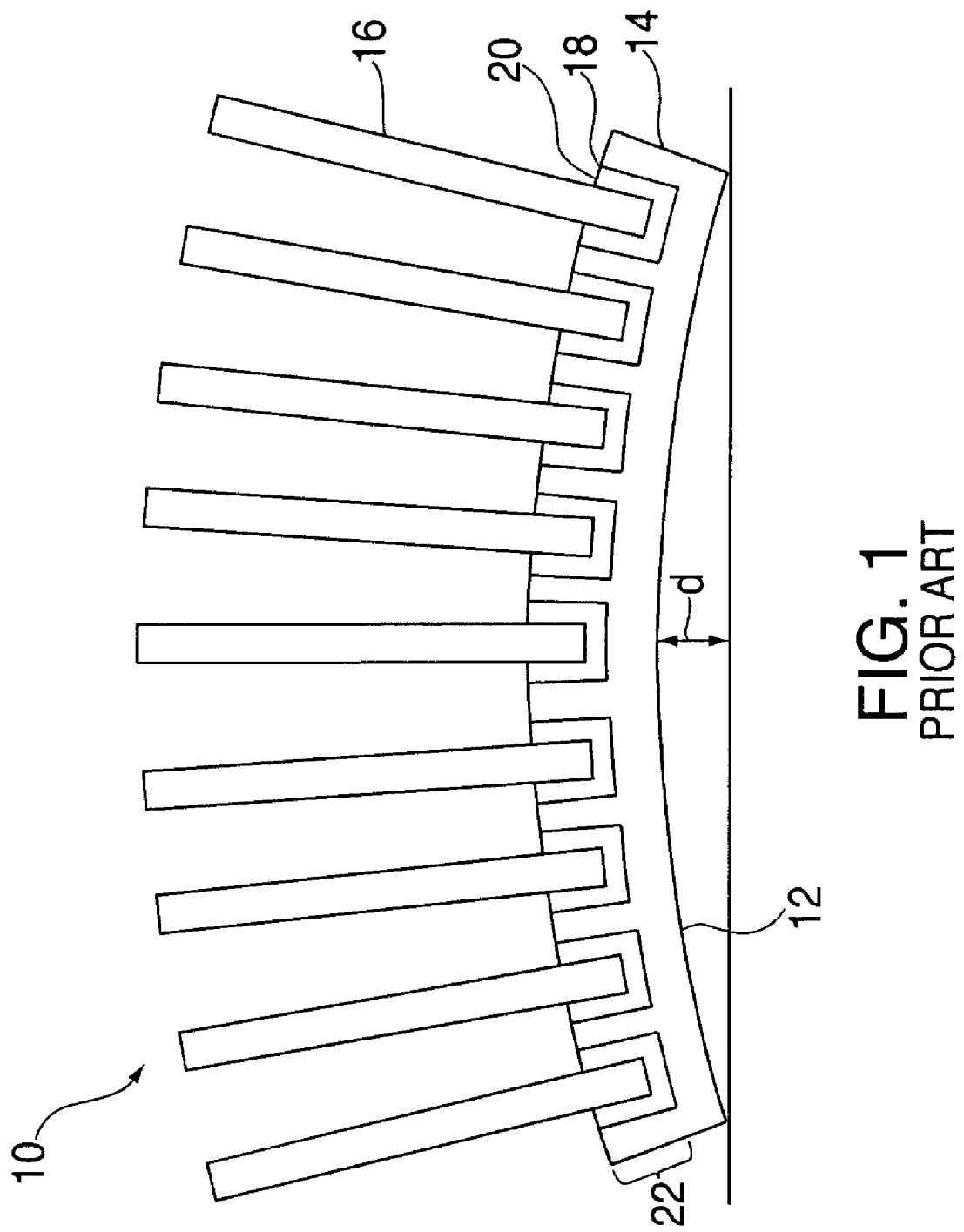
FIG. 1 depicts a conventional heat sink.
Figure 2:
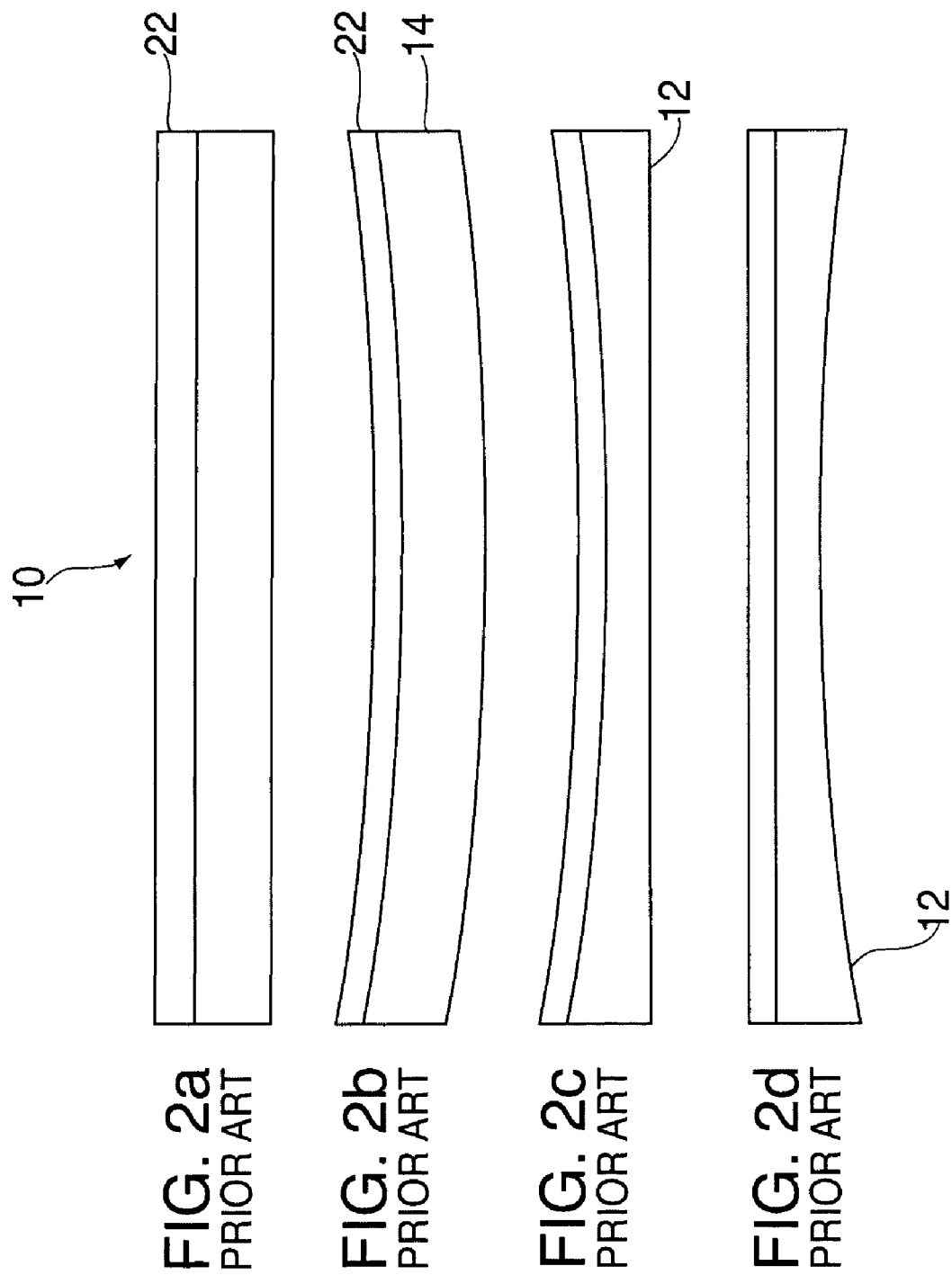
FIGS. 2a–2d depict a manufacturing process for the heat sink of FIG. 1.
Figure 3:
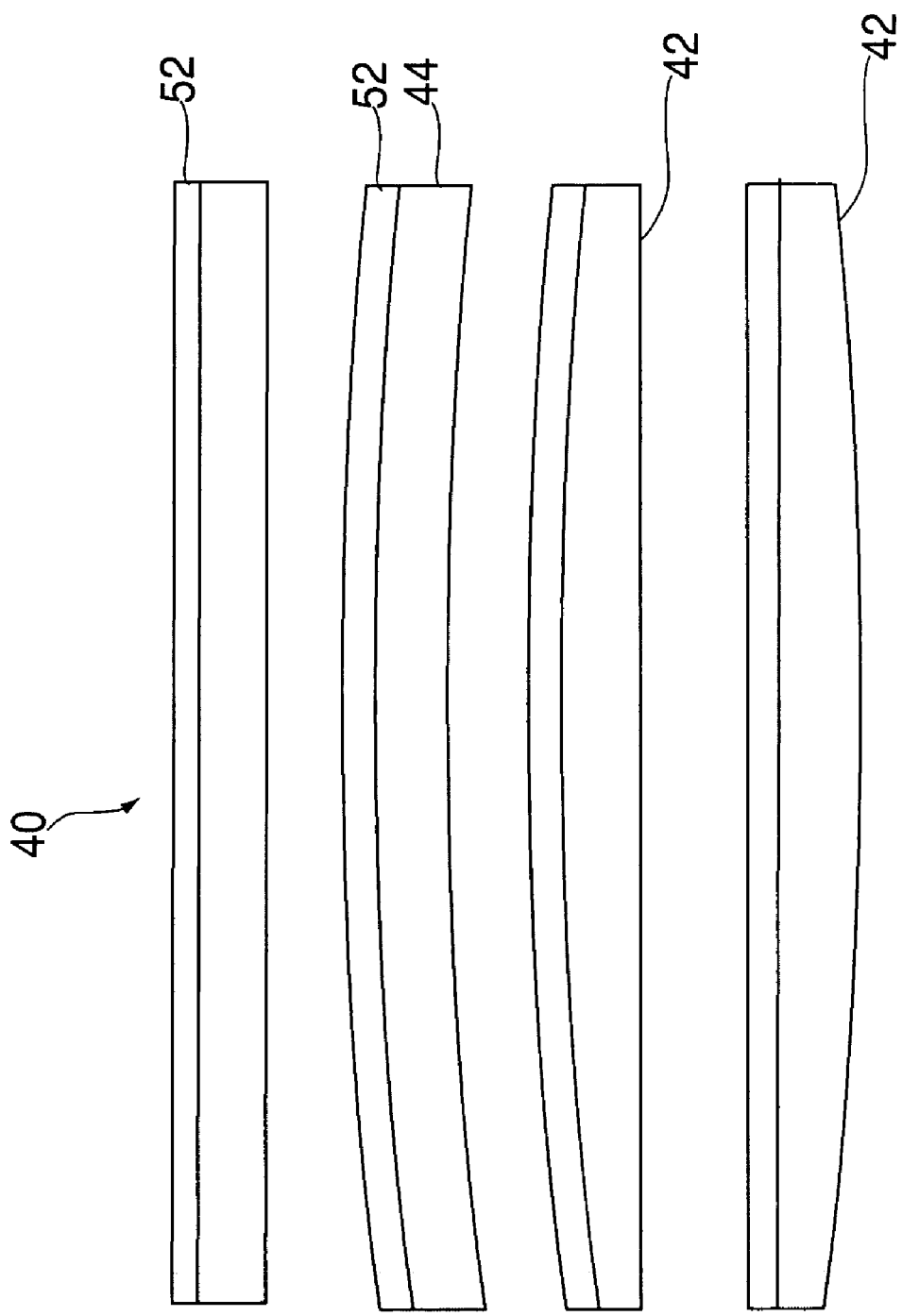
FIGS. 3a–3d depict a manufacturing process of a heat sink in an exemplary embodiment of the invention.

FIGS. 3a–3d illustrate the manufacturing process for heat sink 40 of FIG. 4. The upper portion of base 44 including grooves 48, solder 50 and a portion of base 44 is represented as region 52 for convenience of illustration. FIG. 3a depicts heat sink 40 heated above a melting temperature of solder 50. Fins 46 are positioned in grooves 48 in solder 50. The heat sink 40 is then cooled to room temperature as shown in FIG. 3b. Due to the differing coefficients of thermal expansion (CTE) between solder 50 and base 44/fins 46, the solder 50 goes into compression and the base 44 goes into tension. This causes the thermal face 42 to become concave. The CTE of the solder 50 is about 15 ppm/C and the CTE of the copper base 44 and copper fins 46 is about 17 ppm/C.

The thermal face 42 is then machined to be planar as shown in FIG. 3c. Over time, the compressive stresses in solder 50 relieve and solder 50 shrinks. The tensile stresses in copper base 44 relieve over time and the copper base 14 stretches (i.e., stress relaxation). This results in thermal face 42 being convex as shown in FIG. 3d. The degree of convexity may be up to about 25 micrometers. The convexity of thermal face 42 results in improved contact between the heat sink 40 and the surface from which heat is to be transferred and improved heat transfer performance. This is particularly true if fasteners 60 (e.g., bolts) around the periphery of base 44 are used to secure heat sink 40 to a surface. Fasteners 60 pull the edges of base 44 down to provide compressive force against the thermal face 42.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention is not to be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method for manufacturing a heat sink comprising:
    heating a metal base to melt solder in grooves formed in said base, said base having a first coefficient of thermal expansion, said solder having a second coefficient of thermal expansion lower than said first coefficient of thermal expansion;
    positioning fins in said grooves, said fins having said first coefficient of thermal expansion;
    cooling said metal base and said solder, said metal base experiencing tensile stresses and said solder experiencing compressive stresses to form a concavity in a thermal face of said base;
    planing said thermal face to form a planar thermal face;
    wherein said tensile stresses and said compressive stresses relax over time such that said planar thermal face becomes convex.

2. The method of claim 1 wherein:
    said first coefficient of thermal expansion is about 17 ppm/C and said second coefficient of thermal expansion is about 15 ppm/C.

3. The method of claim 1 wherein:
    said base and said fins are made from the same material.

4. The method of claim 3 wherein:
    said base and said fins are copper.

5. The method of claim 1 wherein:
    said base is copper and said solder is 90In-10Ag solder.

6. The method of claim 1 wherein:
    said base is copper and said solder is Sn—Bi solder.

7. The method of claim 1 further comprising:
    installing fasteners around a periphery of said base for securing said base to a surface.

* * * * *